United States Patent
Tsuto

(10) Patent No.: US 6,363,022 B2
(45) Date of Patent: Mar. 26, 2002

(54) SEMICONDUCTOR MEMORY DEVICE TESTER

(75) Inventor: Masaru Tsuto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/922,351

(22) Filed: Aug. 2, 2001

(30) Foreign Application Priority Data

Aug. 3, 2000 (JP) ...................................... 2000-235635

(51) Int. Cl.[7] .............................................. G11C 7/00
(52) U.S. Cl. ................................................... 365/201
(58) Field of Search ........................... 365/201, 189.01, 365/230.01; 371/21.1, 21.2, 21.5

(56) References Cited

U.S. PATENT DOCUMENTS

| | | | | |
|---|---|---|---|---|
| 5,499,248 A | * | 3/1996 | Behrens et al. ............. | 371/22.1 |
| 5,553,021 A | * | 9/1996 | Haraguchi .................. | 365/201 |
| 5,708,614 A | * | 1/1998 | Koshikawa ................. | 365/201 |
| 6,011,748 A | * | 1/2000 | Lepejian et al. ............ | 365/233 |
| 6,181,616 B1 | * | 1/2001 | Byrd .......................... | 365/201 |

* cited by examiner

Primary Examiner—Richard Elms
Assistant Examiner—Tuan T. Nguyen
(74) Attorney, Agent, or Firm—David N. Lathrop, Esq.; Gallagher & Lathrop

(57) ABSTRACT

A pattern generator generates parallel pattern data and applies it to packet generating parts provided corresponding to row-address and column-address pins of a memory device under test. The pattern generator contains a packet select signal generating part that generates two packet select signals for generating respective cycle numbers in a sequence of cycles in an arbitrary packet period. In data setting parts provided corresponding to the row-address and column-address pins, respectively, bit positions of the data to be fed to the corresponding pins in the parallel pattern data are prestored in correspondence with the cycle numbers. In each cycle the bit positions corresponding to the cycle number are read out by the packet select signals corresponding to the row-address and column-address pins, and in the corresponding packet generating parts data bits corresponding to their bit positions in the parallel pattern data are selected and provided to the corresponding pins.

4 Claims, 12 Drawing Sheets

FIG. 3

| CYPA0 to CYPA3 | 121-A | 121-B | 121-C | CYPB0 to CYPB3 | 121-D | 121-E | 121-F | 121-G | 121-H |
|---|---|---|---|---|---|---|---|---|---|
| 0 (0000) | FL | FL | FL | 0 (0000) | FL | FL | FL | FL | FL |
| 1 (0001) | C0 | C1 | C2 | 1 (0001) | C6 | C7 | C8 | C9 | C10 |
| 2 (0010) | C3 | C4 | C5 | 2 (0010) | C11 | C12 | C13 | C14 | C16 |
| 3 (0011) | X11 | X12 | X13 | 3 (0011) | MD7 | MD6 | MD15 | MD14 | MD13 |
| 4 (0100) | X14 | X15 | FL | 4 (0100) | MD5 | MD4 | MD12 | MD11 | MD10 |
| 5 (0101) | FL | FL | FH | 5 (0101) | MD3 | MD2 | MD9 | MD8 | C16 |
| 6 (0110) | X8 | X7 | X6 | 6 (0110) | MD1 | MD0 | MD9 | Y15 | Y14 |
| 7 (0111) | X5 | X4 | X3 | 7 (0111) | FL | Y5 | Y13 | Y12 | Y11 |
| 8 (1000) | X2 | X1 | X0 | 8 (1000) | Y4 | Y3 | Y2 | Y1 | Y0 |

ROW DATA SET FOR GENERATING ROW-ADDRESS PACKET SIGNAL PG2

COL DATA SET FOR GENERATING COLUMN-ADDRESS PACKET SIGNAL PG4

FIG. 5A
DATA      X0, X1, . . ., X15, Y0, Y1, . . ., Y15, C0, C1, . . ., C16, MD0, MD1, . . ., MD15
BIT POSITION  0, 1, . . ., 15, 16, 17, . . ., 31, 32, 33, . . ., 48,   49,   50, . . ., 64
PRIOR ART
FIG. 5B
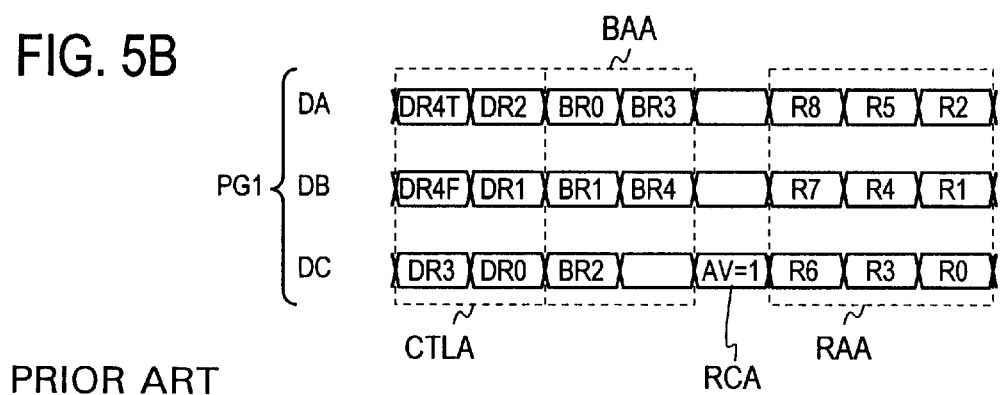
PRIOR ART
FIG. 5C
PRIOR ART
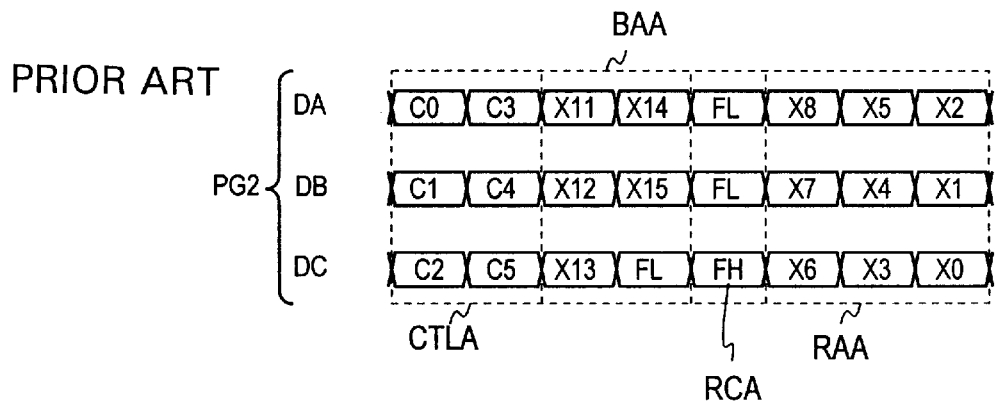

PRIOR ART

PRIOR ART

FIG. 9

| CYP0 to CYP3 | 121-A | 121-B | 121-C |
|---|---|---|---|
| 0 (0000) | FL | FL | FL |
| 1 (0001) | C0 | C1 | C2 |
| 2 (0010) | C3 | C4 | C5 |
| 3 (0011) | X11 | X12 | X13 |
| 4 (0100) | X14 | X15 | FL |
| 5 (0101) | FL | FL | FH |
| 6 (0110) | X8 | X7 | X6 |
| 7 (0111) | X5 | X4 | X3 |
| 8 (1000) | X2 | X1 | X0 |

ROW DATA SET FOR GENERATING ROW-ADDRESS PACKET SIGNAL PG2

FIG. 10

| CYP0 to CYP3 | 121-D | 121-E | 121-F | 121-G | 121-H |
|---|---|---|---|---|---|
| 0 (0000) | FL | FL | FL | FL | FL |
| 1 (0001) | C6 | C7 | C8 | C9 | C10 |
| 2 (0010) | C11 | C12 | C13 | C14 | C15 |
| 3 (0011) | MD7 | MD6 | MD15 | MD14 | MD13 |
| 4 (0100) | MD5 | MD4 | MD12 | MD11 | MD10 |
| 5 (0101) | MD3 | MD2 | MD9 | MD8 | C16 |
| 6 (0110) | MD1 | MD0 | FL | Y15 | Y14 |
| 7 (0111) | FL | Y5 | Y13 | Y12 | Y11 |
| 8 (1000) | Y4 | Y3 | Y2 | Y1 | Y0 |

COL DATA SET FOR GENERATING COLUMN-ADDRESS PACKET SIGNAL PG4

PRIOR ART

FIG. 13

| | CYP | 121-A | 121-B | 121-C | 121-D | 121-E | 121-F | 121-G | 121-H |
|---|---|---|---|---|---|---|---|---|---|
| | 0 | FL | FL | FL | FL | FL | FL | FL | FL |
| PRIOR ART | 1 | C0 | C1 | C2 | C6 | C7 | C8 | C9 | C10 |
| | 2 | C3 | C4 | C5 | C11 | C12 | C13 | C14 | C15 |
| | 3 | X11 | X12 | X13 | MD7 | MD6 | MD15 | MD14 | MD13 |
| 3rd MODE | 4 | X14 | X15 | FL | MD5 | MD4 | MD12 | MD11 | MD10 |
| | 5 | FL | FL | FH | MD3 | MD2 | MD9 | MD8 | C16 |
| | 6 | X8 | X7 | X6 | MD1 | MD0 | FL | Y15 | Y14 |
| | 7 | X5 | X4 | X3 | FL | Y5 | Y13 | Y12 | Y11 |
| | 8 | X2 | X1 | X0 | Y4 | Y3 | Y2 | Y1 | Y0 |
| | 9 | FL | FL | FL | C6 | C7 | C8 | C9 | C10 |
| | 10 | FL | FL | FL | C11 | C12 | C13 | C14 | C15 |
| | 11 | FL | FL | FL | MD7 | MD6 | MD15 | MD14 | MD13 |
| 2nd MODE | 12 | FL | FL | FL | MD5 | MD4 | MD12 | MD11 | MD10 |
| | 13 | FL | FL | FL | MD3 | MD2 | MD9 | MD8 | C16 |
| | 14 | FL | FL | FL | MD1 | MD0 | FL | Y15 | Y14 |
| | 15 | FL | FL | FL | FL | Y5 | Y13 | Y12 | Y11 |
| | 16 | FL | FL | FL | Y4 | Y3 | Y2 | Y1 | Y0 |
| | 17 | C0 | C1 | C2 | FL | FL | FL | FL | FL |
| | 18 | C3 | C4 | C5 | FL | FL | FL | FL | FL |
| | 19 | X11 | X12 | X13 | FL | FL | FL | FL | FL |
| 1st MODE | 20 | X14 | X15 | FL | FL | FL | FL | FL | FL |
| | 21 | FL | FL | FH | FL | FL | FL | FL | FL |
| | 22 | X8 | X7 | X6 | FL | FL | FL | FL | FL |
| | 23 | X5 | X4 | X3 | FL | FL | FL | FL | FL |
| | 24 | X2 | X1 | X0 | FL | FL | FL | FL | FL |
| | 25 | FL | FL | FL | C6 | C7 | C8 | C9 | C10 |
| | 26 | C0 | C1 | C2 | C11 | C12 | C13 | C14 | C15 |
| | 27 | C3 | C4 | C5 | MD7 | MD6 | MD15 | MD14 | MD13 |
| | 28 | X11 | X12 | X13 | MD5 | MD4 | MD12 | MD11 | MD10 |
| 4th MODE | 29 | X14 | X15 | FL | MD3 | MD2 | MD9 | MD8 | C16 |
| | 30 | FL | FL | FH | MD1 | MD0 | FL | Y15 | Y14 |
| | 31 | X8 | X7 | X6 | FL | Y5 | Y13 | Y12 | Y11 |
| | 32 | X5 | X4 | X3 | Y4 | Y3 | Y2 | Y1 | Y0 |
| | 33 | X2 | X1 | X0 | FL | FL | FL | FL | FL |

SEMICONDUCTOR MEMORY DEVICE TESTER

BACKGROUND OF THE INVENTION

The present invention relates to a semiconductor memory device tester for testing memory devices of the type that do data input and output in packet format.

With a view to avoiding an increase in the number of address pins by increased memory capacity, RDRAM-type memory devices are now widely used in which a packet signal containing address data, write data, control signal data and so forth is applied as parallel data to a smaller number of pins than the number of digits of the memory address over a plurality of cycles and in the memory device the address data, the control signal data and so forth are reconstructed from the parallel data. In testing the memory device of this type, too, pattern data containing address data, write data and control signal data for test use is converted to a packet signal for application as parallel data to a plurality of pins of the memory device over a plurality of cycles.

In FIG. 4 there is illustrated in block form the general construction of a conventional semiconductor device tester for testing semiconductor memory devices which perform input and output of data in packet form. The FIG. 4 configuration is shown to include a minimum number of constituent elements necessary to describe the present invention. That is, a typical IC tester comprises a pattern generator 11, a programmable data select part 12 and a logic comparison part 14. The programmable data select part 12 is made up of a plurality of channels 15A to 15H corresponding to pins of a memory device under test (hereinafter referred to as a DUT) 13, respectively. The channel 15A comprises a packet generating part 12A, a data setting part 121-A and a data selection control part 122-A, and each of the other channels 15B to 15H is also similarly constructed.

The pattern generator 11 generates, for example, 65-bit parallel pattern data X0 to X15, Y0 to Y15, C0 to C16 and MD0 to MD15 as shown in FIG. 5A and a parallel 4-bit packet select signal CYP=(CYP0, . . . , CYP3) that changes at every cycle. These 65-bit parallel pattern data and 4-bit parallel packet select signal are provided to all the channels 15A to 15H in common to them. The bit positions of the 65 bits of the parallel pattern data are defined by, for instance, numbers 0 to 64. The packet generating parts 12A to 12H in the channels 15A to 15H each appropriately select and output a data bit in the 65-bit pattern data at a specified bit position. As a result of this, the pattern data X0 to X15, Y0 to Y15, C0 to C16 and MD0 to MD15 are rearranged by the channels 15A to 15H on the time axis to form an 8-channel packet signal. The packet signal thus obtained is input to the DUT 13.

Output data (provided in packet format) OT from the DUT 13 is provided to the logic comparison part 14, wherein it is compared with expected value data EV output in packet form from the programmable data select part 12 to determine whether the DUT 13 is defective or nondefective, and the logic comparison part 14 gives pass/fail results P/F.

Now, a description will be given of the format that is defined by the DUT 13 for the packet signal applied to its input terminal and the format of the packet signal that is generated from the pattern data fed from the pattern generator 11 in accordance with the format defined by the DUT 13. FIG. 5B depicts a row-address packet signal format PG1 that is defined by the DUT 13 for a packet signal provided as pin data DA, DB and DC to three row address pins A, B and C of the DUT 13. FIG. 6A depicts a column-address packet signal format PG3 that is defined by the DUT 13 for a packet signal provided as pin data DD, DE, DF, DG and DH to five column address pin D, E, F, G and H of the DUT 13.

As depicted in FIG. 5B, the row-address packet signal format PG1 defined by the DUT 13 has a parallel 3-bit, 8-cycle configuration, which includes a 3-by-3 bit area CTLA for control signal, a 3-by-2 bit area BAA for bank address signal, a 3-by-3 bit area RAA for row address signal, and a 3-bit area RCA for recognition signal inserted between the bank address signal area BAA and the row address signal area RAA. In these areas CTLA, BAA, RCA and RAA there are sequentially allocated on a bitwise basis control signal bits DR4T, DR4F and DR3 to DR0, bank address bits BR0 to BR4, a recognition signal bit AV and row-address signal bits R8 to R0. Accordingly, the bank address signal area BAA has a 1-bit blank, and the recognition signal area RCA has a 2-bit blank. For these three blanks of bits and a recognition signal bit AV, data are produced by the packet generating parts 12A, 12B and 12C rather than by the pattern generator 11. The parallel 3-bit data thus produced is provided to the three row address pins A, B and C for each cycle following this format PG1.

As described above, this example uses, as a control signal indicating the beginning of the packet, the 6-bit data DR4T, DR4F and DR3 to DR0 input to the row address pins A, B and C of the DUT 13 in first and second cycles. Further, 5-bit data BR0 to BR4 input to the row-address pins A, B and C in third and fifth cycles is used as a bank address signal for bank specification in the DUT 13, and 9-bit data R8 to R0 input in sixth to eighth cycles is used as a row address signal. The recognition signal AV=1 input to the pin C in a fifth cycle indicates that the 8-cycle input packet signal is a packet signal for row address input use.

FIG. 5C shows a structure of a packet signal PG2 generated from the output pattern signal of the pattern generator 11 in accordance with the row-address packet signal format PG1 of FIG. 5B defined by the DUT 13. Thus, the row-address packet signal defines which of bits of the pattern data X0 to X15, Y0 to Y15, C to C16 and MD0 to MD15 is assigned to which input pin and in which cycle. In this example, the pattern data C0 to C5 is assigned to the control signal bits DR4T, DR4F and DR3 to DR0; the pattern data X11 to X15 is assigned to the bank address bits BR0 to BR4; and the pattern data X0 to X8 is assigned to the row address signal bits R0 to R8. The blanks in the format PG1 of FIG. 5B are each assigned with "L" logic denoted by FL and the recognition signal bit AV=1 is assigned with "H" logic denoted by FH.

FIG. 6A shows a packet signal format PG3 for the column address side. The column-address packet signal has an 8-cycle configuration, as is the case with the row-address packet signal. In a control signal area CTLA, control signal bits DC4 to DC0 are assigned to five pins D to H in the first cycle and control signal bits COP1, COP0 and COP3 are assigned to the pins F, G and H in the second cycle. In a recognition signal area RCA, recognition signal bits S and M are assigned to the pins D and E in the second cycle. In a mask data area MDA, mask data MA7 to MA0 are assigned to the pins D and E on a bitwise basis, and the mask data MA7 to MA0 are assigned to the pins F, G and H in the third to sixth cycles. In an area RCA at the fifth cycle, the recognition signal bit COP2 is assigned to the pin H. In a bank address area BAA, a blank and bank address signals BC4 to BC0 are assigned to the pins F, G and H in two cycles, and in a column-address area CAA column-address signal bits COL5 to COL0 are assigned to the pin E in a seventh cycle and to the pins D to H in the eighth cycle on a bitwise basis. Blanks are assigned to the pin F in the sixth cycle and to the pin D in the seventh cycle.

FIG. 6B shows a packet signal format PG4 generated from the pattern data X0 to X15, Y0 to Y15, C0 to C16 and MD0 to MD15 in accordance with the column-address packet signal format PG3 depicted in FIG. 6A. As will be seen from FIGS. 6A and 6B, this example shows the case of assigning the pattern data C6 to C10 to the control signal bits DC0 to DC4, the pattern data C13 to C16 to the control signal bits COP1 to COP3, the pattern data MD0 to MD15 to the mask data signal bits MA0 to MA7 and MB0 to MB7, the pattern data Y11 to Y15 to the bank address signal bits BC0 to BC4, and the pattern data Y0 to Y5 to the column-address signal bits COL0 to COL5. To those blanks in the format PG3 in FIG. 6A are each assigned "L" logic denoted by FL.

In the channels 15A to 15H, the bit positions in the 65-bit parallel data, which specify the pattern data bits to be output in the respective cycles as shown in FIGS. 5C and 6B, are prestored as pieces of pattern select data in the data setting parts 121-A to 121-H by the cycle sequence. The data selection control parts 122-A to 122-H select, from the pieces of pattern select data stored in the data setting parts 121-A to 121-H, the pattern select data corresponding to the cycle numbers indicated by the packet select signal CYP=(CYP0, . . . , CYP3) provided from the pattern generator 11, and output the selected data as pattern select signals. The packet generating parts 12A to 12H select pattern data bits corresponding to the bit positions indicated by the pattern select signals from the pattern data X0 to X15, Y0 to Y15, C0 to C16 and MD0 to MD15.

FIGS. 9 and 10 show, by way of example, the pattern data set in the data setting parts 121-A through 121-C and 121-D through 121-H in accordance with the row-address packet signal format and the column-address packet signal format defined in FIGS. 5C and 6A. The bit positions of the pattern data bits assigned to the pins A to H corresponding to the channels 15A to 15H in the first to eighth cycles are stored as pattern select signal in association with values (0001) to (1000) of the packet select signal CYP=(CYP0, . . . , CYP3) corresponding to the first to eighth cycles. In the tables of FIGS. 9 and 10, however, for the zeroth cycle (0000) in which a packet generation is not preformed, there is stored pattern select data which designates selection of all "L" logic.

For example, in the first cycle of the packet generation, the packet select signal CYP=(CYP0, . . . , CYP3) is (0001), and bit position data of the pattern data C0 to C2 is written in the data setting parts 121-A to 121-C. To facilitate easy understanding, the bit position data is indicated by the same reference characters C0 to C2 as the pattern signal data; these reference characters C0 to C2 represent binary data (100000) to (100010) of the numbers respectively corresponding to the data bit positions 32 to 34 shown in FIG. 5A. In the data setting parts 121-D to 121-H (see FIG. 4), too, there are set pieces of bit position data on the pattern data C6 to C10, respectively. Similarly, pieces of pattern select data representing pattern data bit positions in the respective cycles shown in FIGS. 5C and 6B are prestored in the data setting parts 121-A to 121-H in correspondence with the cycle numbers 2 to 8 of the packet select signal CYP=(CYP0, . . . , CYP3). Accordingly, in the data setting part 121-A of the channel 15A there are set bit positions of pattern data bits FL, C0, C3, X11, X14, FL, X8, X5 and X2. In the data setting parts 121-B to 121-H in the other channels 15B to 15H, too, there are set the bit positions of the pattern data bits shown in FIGS. 9 and 10.

The data selection control parts 122-A to 122-H in the channels 15A to 15H read out of the data setting parts 121-A to 121-H, respectively, the data bit positions corresponding to the packet select signal CYP=(CYP0, . . . , CYP3) fed thereto, and provide them as pattern select signals to the packet generating parts 12A to 12H, respectively. The packet signal generating parts 12A to 12H select the data bits of the bit positions, indicated by the pattern select signals applied thereto, from among the 65-bit parallel pattern data provided in common thereto, and output the selected data bits as parallel 8-bit data in their entirety. By repeating this operation for the respective cycles of the values (0001) to (1000) of the packet select signal CYP=(CYP0, . . . , CYP3) during the packet signal period, the row-address and column-address packet signals are generated which are shown in FIGS. 5C and 6B.

FIGS. 7 and 8 are timing charts for explaining the operations of generating the packet from the pieces of pattern select data stored in the data setting parts 121-A to 121-H in the examples of FIGS. 9 and 10. FIGS. 7A, 7B, 8A, 8B and 8C depict pattern data that is output from the pattern generator 11, the FIGS. 7C and 8D depict the same packet select signal that is output from the pattern generator 11.

During the packet generation the same data is derived from the pattern data. On the other hand, the packet select signal CYP=(CYP0, . . . , CYP3) is changed from 1 to 8 in a sequential order, and the bit position data indicated by the packet select signal CYP=(CYP0, . . . , CYP3) is selected as pattern select data, for each cycle, from among the pieces of pattern select data stored in the data setting parts 121-A to 121-H and is input to the packet generating parts 12A to 12H, which select patter data bits at the bit positions indicated by the pattern select data to thereby generate the packet.

As described above, the packet as defined is generated by changing the packet select signal CYP=(CYP0, . . . , CYP3) as assumed at the time of storing the pieces of pattern select data in the data setting parts 121-A to 121-H but by holding pattern signal data from the pattern generator 11 unchanged. Described so far is an example of simultaneously generating the packets signals PG2 and PG4 defined in FIGS. 5C and 6B.

FIG. 11 shows four modes of packet generation. In first and second modes the packets PG2 and PG4 defined in FIGS. 5C and 6B are generated separately; in the third mode they are generated simultaneously; and in the fourth mode they are generated at timing shifted one cycle apart. In the conventional semiconductor memory device tester described above, since the data selection control parts 122-A to 122-H are controlled by the common packet select signal CYP=(CYP0, . . . , CYP3), it is necessary in each mode to store the pieces of pattern select data in the data setting parts 121-A to 121-H taking into account a combination of the packet signal PG2 defined in FIG. 5C and the packet signal PG4 defined in FIG. 6B. FIG. 13 shows an example of storage of the pattern select data in this instance. Further, the value of the packet select signal CYP needs to be changed taking into account the combination of the packet signals PG2 and PG4 during the packet generation.

The packet generation by the above four modes causes an increase in the number of values that the packet select signal CYP is required to take—this introduces complexity into the operation of storing the pieces of pattern select data in the data setting parts 121-A to 121-H in accordance with the combination of the packet signals PG2 and PG4 and the packet generating operation by changing the packet signal CYP at every cycle. These operations become more complex particularly when the generation cycles of the packet signals PG2 and PG4 defined in FIGS. 5C and 6B, respectively, are variously shifted apart.

To implement the first to fourth modes in FIG. 11, it is necessary to increase the number of bits of the packet select signal CYP and prepare storage areas M1 to M4 in the data setting parts 121-A to 121-H for storing pieces of pattern select data corresponding to the respective modes as depicted in FIGS. 12 and 13. This inevitably enlarges the scale of the data setting parts 121-A to 121-H. In particular, when the generation cycles of the packets PG2 and PG4 are variously shifted apart, the required number of storage areas increases, raising the cost of the semiconductor memory device tester.

SUMMARY OF THE INVENTION

It is therefore an object of the present invention to provide a semiconductor memory device tester that permits independent generation of a row-address packet signal and a column-address packet signal, and hence enables generation of various kinds of packet signals through the use of small-scale data setting parts.

According to the present invention, there is provided a tester for a semiconductor memory device which has at least one row-address input pin for a row-address packet signal and at least one column-address input pin for a column-address packet signal, said tester comprising:

a pattern generator for generating pattern data composed of a predetermined number of parallel bits containing row-address data and column-address data;

a packet select signal generating part provided in said pattern generator, for generating first and second packet select signals for said at least one row-address input pin and said at least one column-address input pin separately of each other, said first and second packet select signals representing the cycle numbers of sequences of cycles in row-address and column-address packet signal periods of respectively preset timing;

a row-address data setting part provided in association with said at least one row-address input pin, for storing pattern select data in correspondence with said cycle numbers of said row-address packet signal period, said pattern select data specifying bit positions, in said pattern data, of pin data to be provided in a format defined by said semiconductor memory device to said at least one row-address input pin in respective cycles of said cycle numbers of said row-address packet signal period;

a column-address data setting part provided in association with said column-address input pin, for storing pattern select data in correspondence with said cycle numbers of said column-address packet signal period, said pattern select data specifying bit positions, in said pattern data, of pin data to be provided in a format defined by said semiconductor memory device to said at least one column-address input pin in respective cycles of said cycle numbers of said column-address packet signal period;

a row-address data selection control part provided in association with said row-address data setting part and supplied with one of said first and second packet select signals from said pattern generator, for selecting from among said pattern select data stored in said row-address data setting part the pattern select data corresponding to the cycle number indicated by said one packet select signal and for outputting said selected pattern select data as a pattern select signal;

a column-address data selection control part provided in association with said column-address data setting part and supplied with the of said first and second packet select signals from said pattern generator, for selecting from among said pattern select data stored in said row-address data setting part the pattern select data corresponding to the cycle number indicated by said other packet select signal and for outputting said selected pattern select data as a pattern select signal;

a row-address packet generating part provided in association with said row-address data setting part and supplied with said pattern select signal from said row-address data selection control part, for supplying to said at least one row-address input pin a pattern data bit selected from among said pattern data from said pattern generator in accordance with said pattern select data indicated by said pattern select signal provided from said row-address data selection control part; and a column-address packet generating part provided in association with said column-address data setting part and supplied with said pattern select signal from said column-address data selection control part, for supplying to said at least one column-address input pin a pattern data bit selected from among said pattern data from said pattern generator in accordance with said pattern select data indicated by said pattern select signal provided from said column-address data selection control part.

Since the semiconductor memory device tester according to the present invention is adapted to output plural kinds of packet select signals from the pattern generator, the row-address packet generating part and the column-address packet generating part are capable of selecting packet signals independently of each other, and hence they can freely perform simultaneous generation of the row- and column-address packet signals, non-generation of them, generation of either one of them, or generation of them at arbitrarily shifted-apart timing. In this instance, the pattern select data corresponding to the packet select signals, which are controlled independently at the row-address side and the column-address side, needs only to be stored in the data setting parts of the respective channels of the semiconductor memory device tester.

Accordingly, the present invention minimizes the construction of the respective data setting part, allowing ease in implementing packet generation with a high degree of flexibility but at low cost.

Further, since the packet select signals can be selected separately for the row-address side and the column-address side of the tester, packets can also be generated easily for semiconductor memory devices having arbitrary numbers of pins forming the packets.

BRIEF DESCRIPTION OF THE DRAWINGS

FIG. 3 is a table for explaining the scale of data preset in data setting parts for use in the memory device tester according to the present invention;

FIG. 5A is a diagram showing the relationship between bit positions and their numbers of parallel pattern data;

FIG. 5B is a diagram showing the format of a row-address packet signal defined in a memory device which is applied to a row-address input pin;

FIG. 5C is a diagram for explaining an example of the allocation of pattern data bits in accordance with the row-address packet signal format;

FIG. 9 is a table depicting data set in data setting parts to generate the row-address packet signal shown in FIG. 7;

FIG. 10 a table depicting data set in data setting parts to generate the column-address packet signal shown in FIG. 8;

FIG. 13 is a table depicting an example of data to be stored in respective storage areas of the data setting parts shown in FIG. 12.

DETAILED DESCRIPTION OF THE PREFERRED EMBODIMENTS

Figure 1:
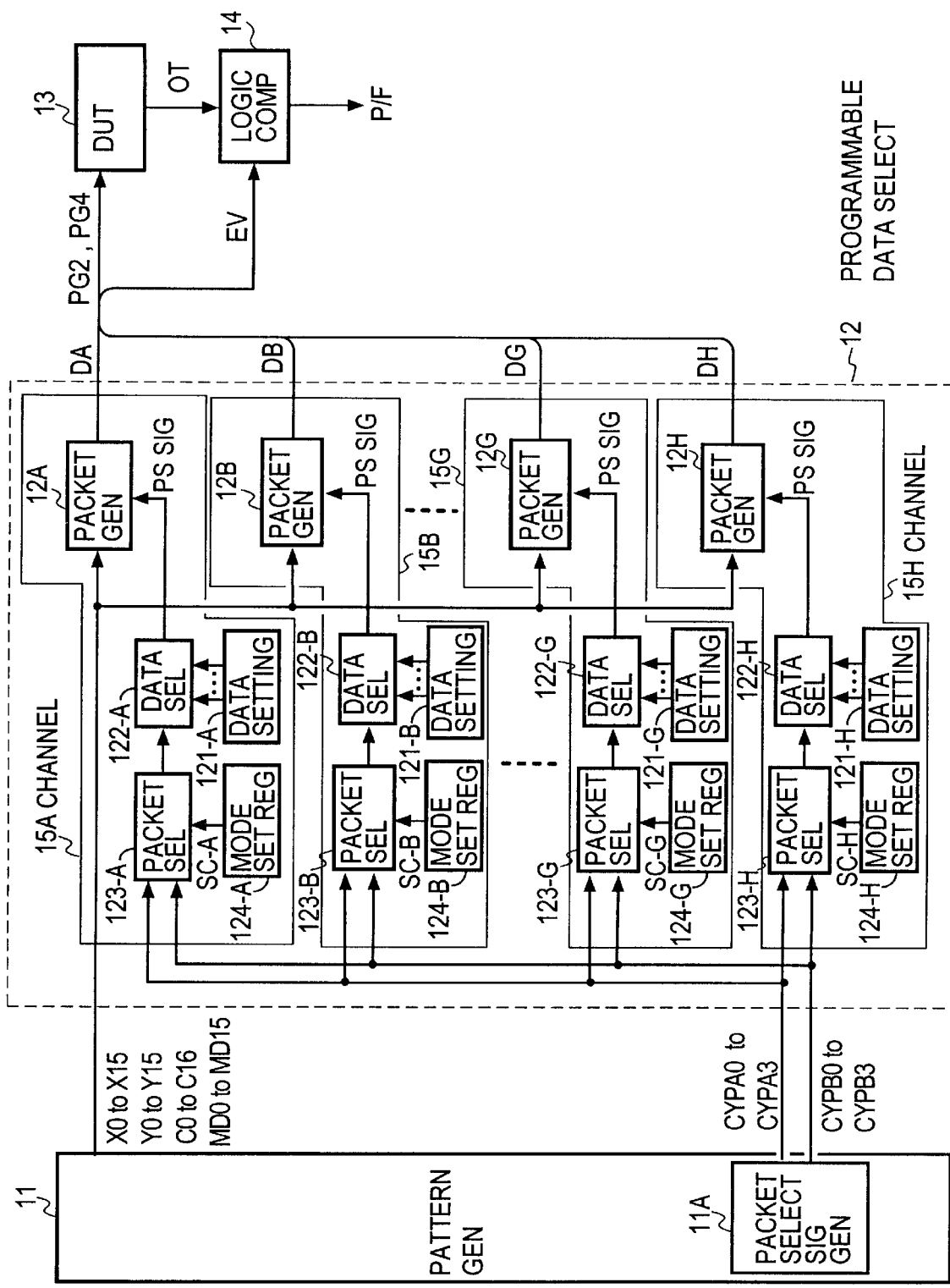
FIG. 1 is a block diagram for explaining an embodiment of the memory device tester according to the present invention.
Figure 4:
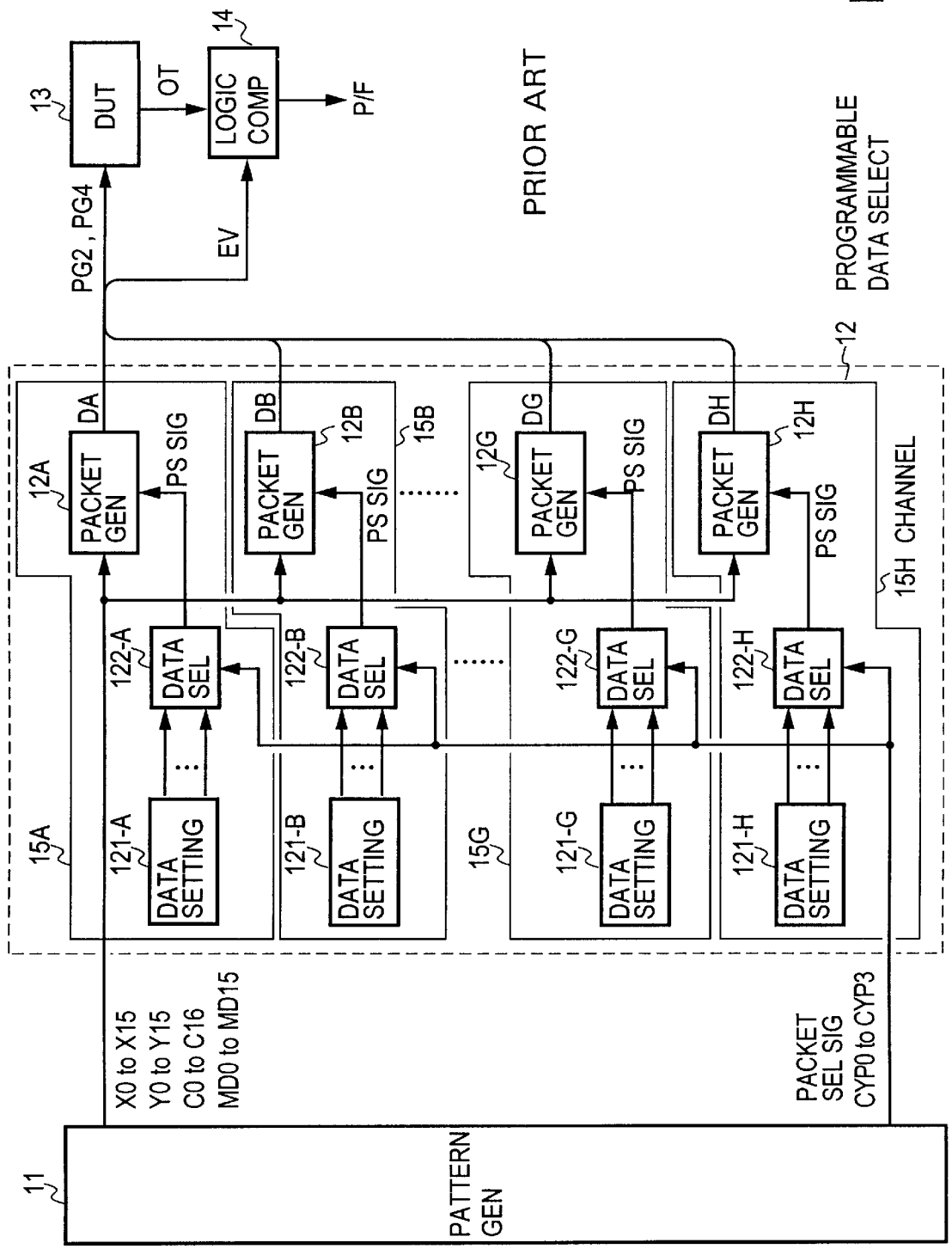
FIG. 4 is a block diagram for explaining the prior art.
Figure 6A:
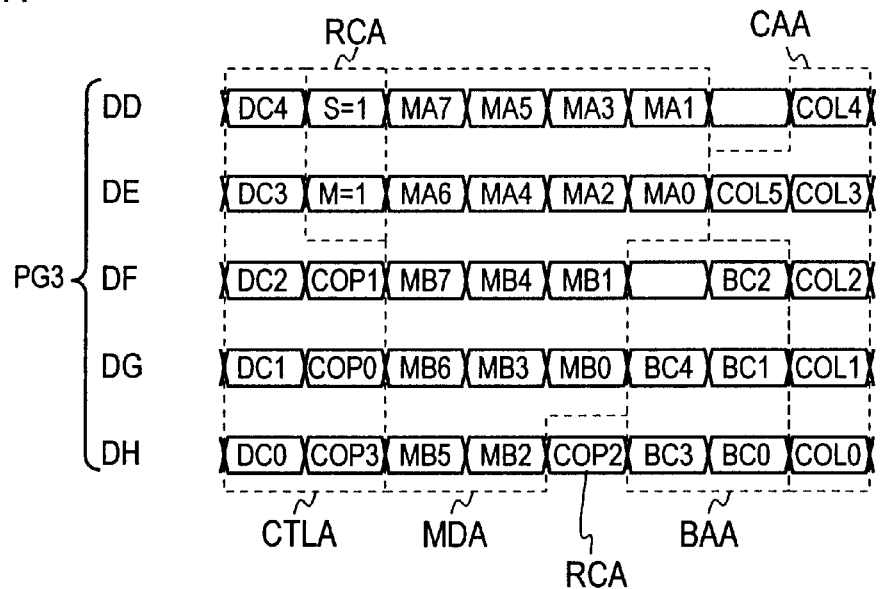
FIG. 6A is a diagram showing the format of a column-address packet signal defined in the memory device which is applied to a column-address input pin.
Figure 6B:
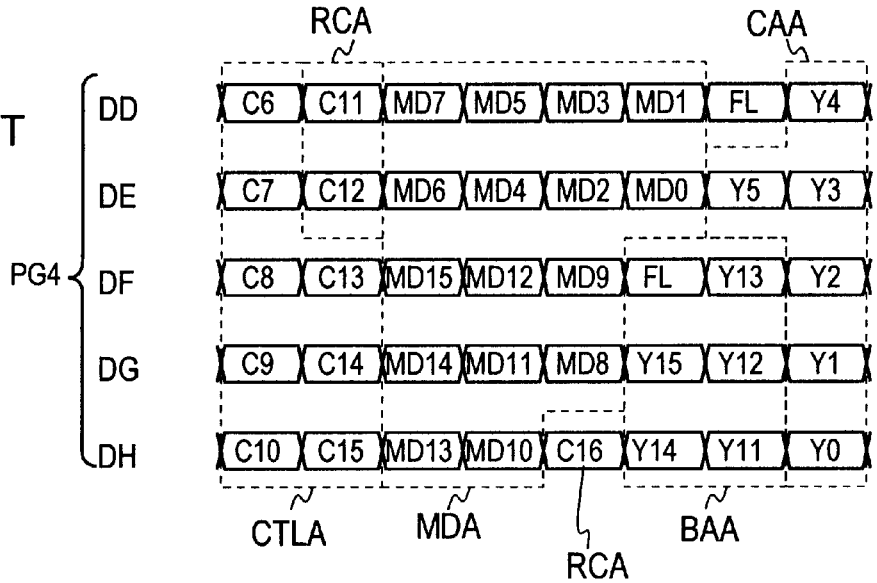
FIG. 6B is a diagram showing an example of the allocation of pattern data bits in accordance with the column-address packet signal format.
Figure 7:
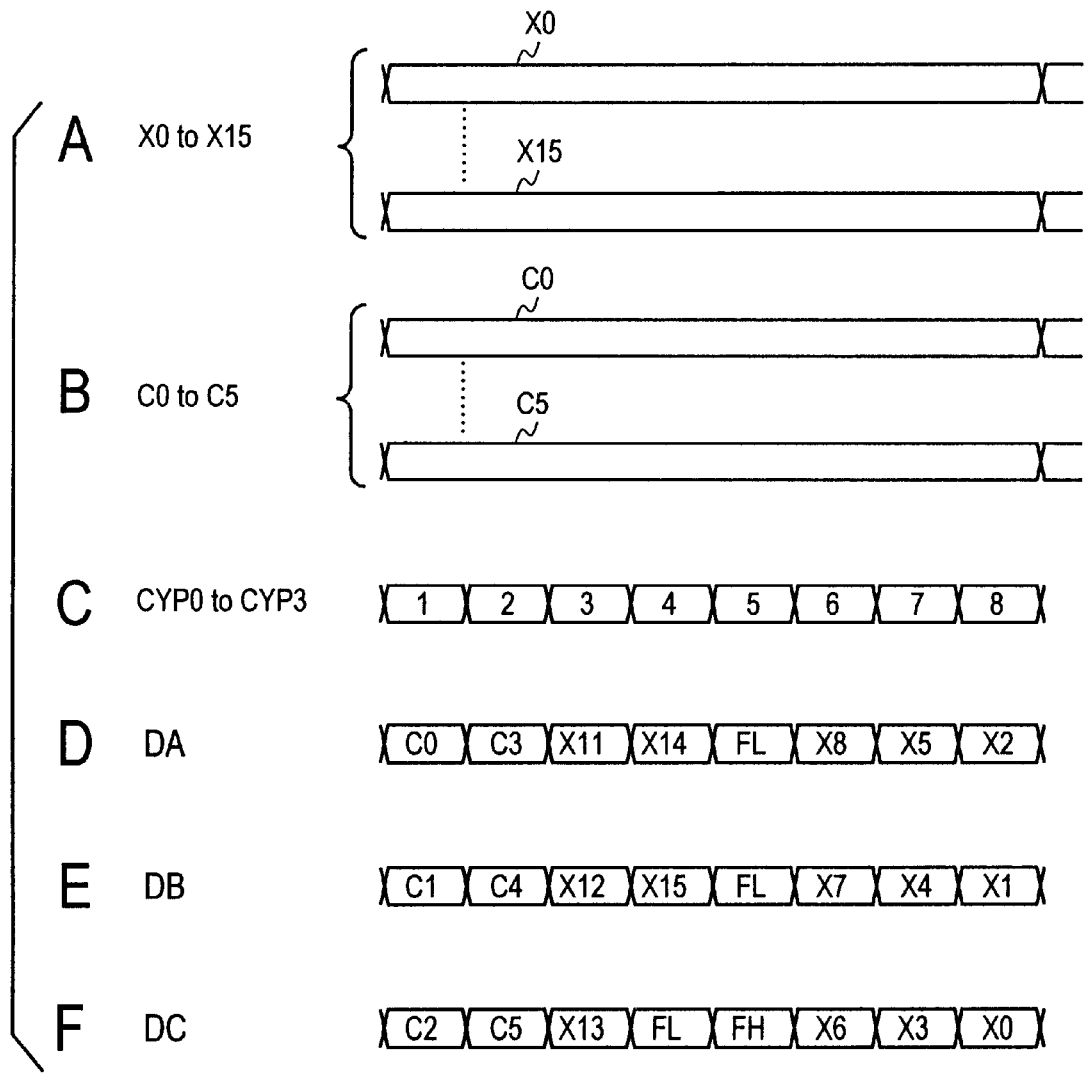
FIG. 7 is a timing chart for explaining the process of generating the row-address packet signal from the pattern data.
Figure 8:
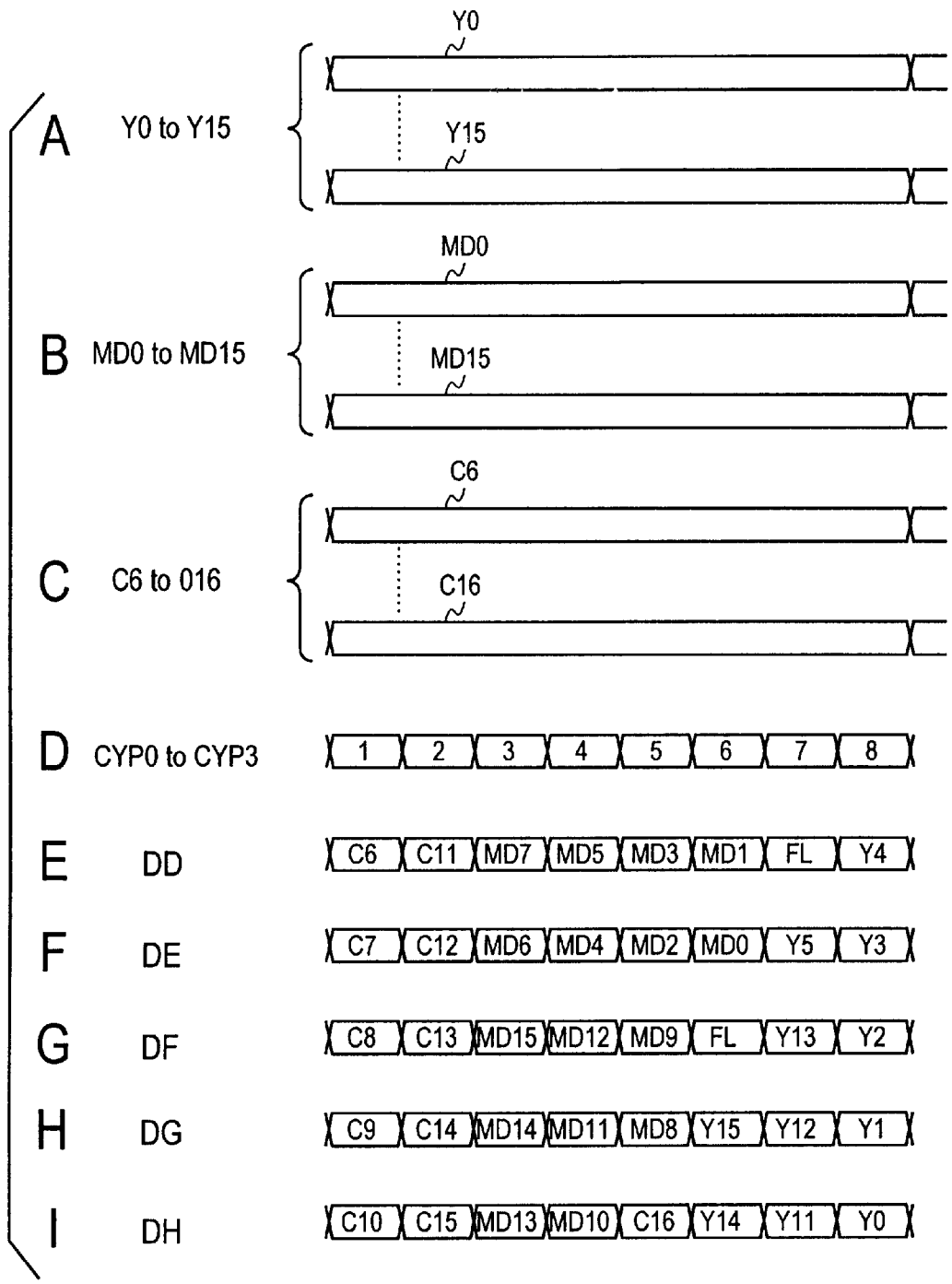
FIG. 8 is a timing chart for explaining the process of generating the column-address packet signal from the pattern data.
Figure 11:
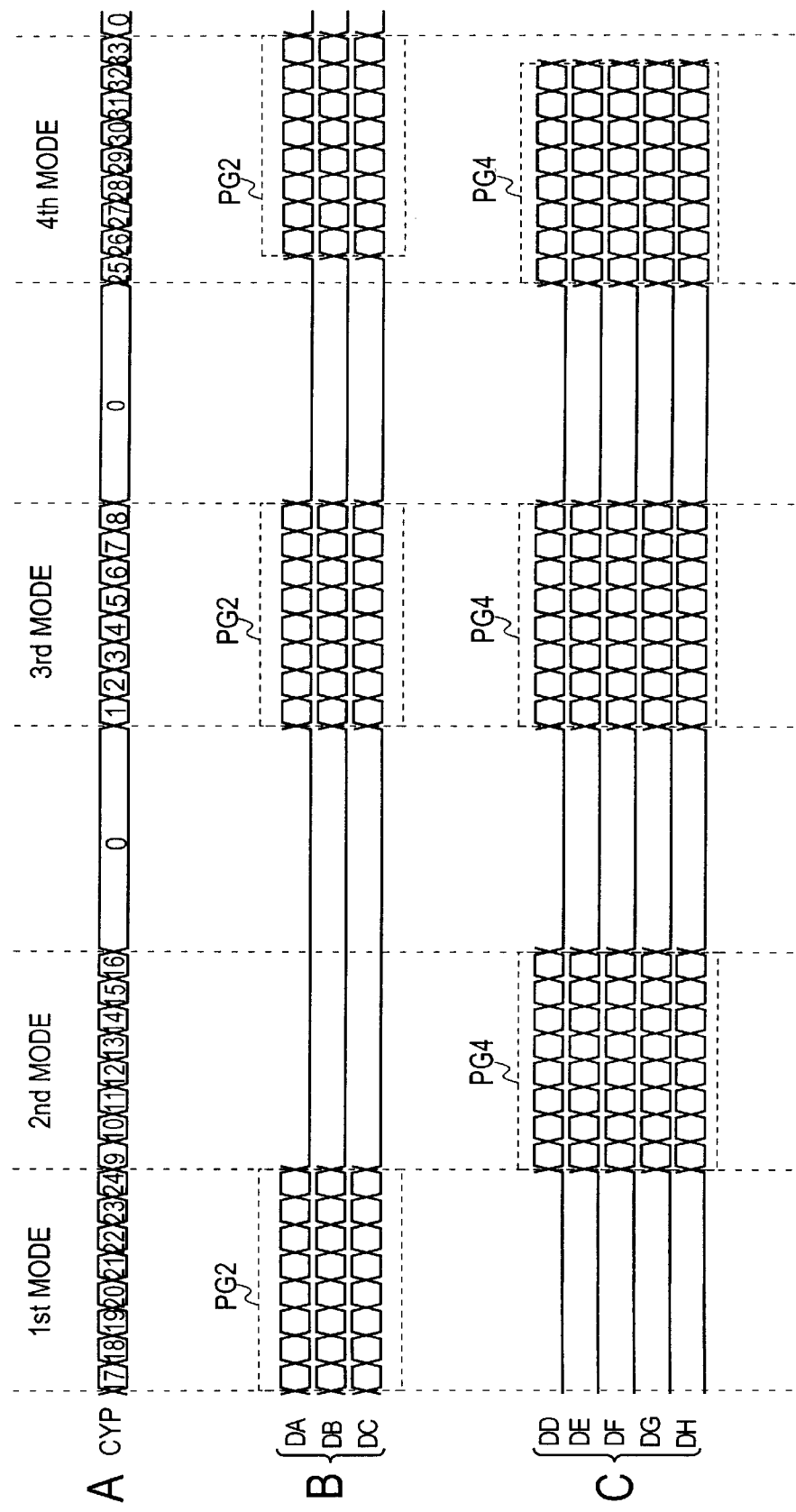
FIG. 11 is a timing chart for explaining packet-generating modes in the prior art.

FIG. 1 illustrates in block form an embodiment of the semiconductor memory device tester according to the present invention. The parts corresponding to those in FIG. 4 are identified by the same reference numerals, and no description will be repeated. According to the present invention, the pattern generator 11 contains a packet signal generating part 11A that generates a plurality of packet select signals for which outputting of cycle numbers can be controlled independently, two packet select signals CYPA=(CYPA0, . . . , CYPA3) and CYPB=(CYPB0, . . . , CYPB3) in this embodiment. Further, the programmable data select part 12 includes packet select parts 123-A to 123-H and mode setting registers 124-A to 124-H. The packet select parts 123-A to 123-H select either one of the packet select signals CYPA0 to PVCA3 and CYPB=(CYPB0, . . . , CYPB3) fed from the packet select signal generating part 11A of the pattern generator 11, and apply the selected packet select signal to the data selection control parts 122-A to 122-H.

A control signal SC-A to SC-H, which is provided from a control unit (not shown) of the memory device tester are preset in the mode setting registers 124-A to 124-H for setting which of the packet select signals CYPA=(CYPA0, . . . , CYPA3) and CYPB=(CYPB0, . . . , CYPB3) is selected by each of the data selection control parts 122-A to 122-H. The packet select signals CYPA=(CYPA0, . . . , CYPA3) and CYPB=(CYPB0, . . . , CYPB3) are shown to be 4-bit signals in this example. The semiconductor memory device tester in this example has eight channels.

A description will be given below of an embodiment which generates the row-address packet for the pin data DA to DC corresponding to the data selection control parts 122-A to 122-C and the column-address packet for the pin data DD to DH corresponding to the data selection control parts 122-D to 122-H.

The packet select parts 123-A to 123-H responds to the control signal SC-A to SC-H to select the packet select signal CYPA=(CYPA0, . . . , CYPA3) for the data selection control part 122-A to 122-C and the packet select signal CYPB=(CYPB0, . . . , CYPB3) for the data selection control parts 122-D to 122-H.

As shown in FIG. 3, the data setting parts 121-A to 121-C have prestored therein in correspondence with the respective values of the packet select signals CYPA=(CYPA0, . . . , CYPA3), pattern select data representing bit positions of the pattern data bits to be selected by the packet generating parts 12A to 12C, and the data setting parts 121-D to 121-H have prestored therein pattern select data representing bit positions of the pattern data bits to be selected by the packet generating parts 12D to 12H.

The stored contents of the data setting parts 121-A to 121-H are the same as the stored contents of the data setting parts 121-A to 121-H in FIGS. 9 and 10. That is, the row-address packet is generated for the pin data DA to DC by changing the value of 4-bit packet select signal CYPA=(CYPA0, . . . , CYPA3) sequentially from 1=(0001) to 8=(1000). Similarly, the column-address packet is generated by changing the value of 4-bit packet select signal CYPB=(CYPB0, . . . , CYPB3) sequentially from 1 to 8.

Figure 2:
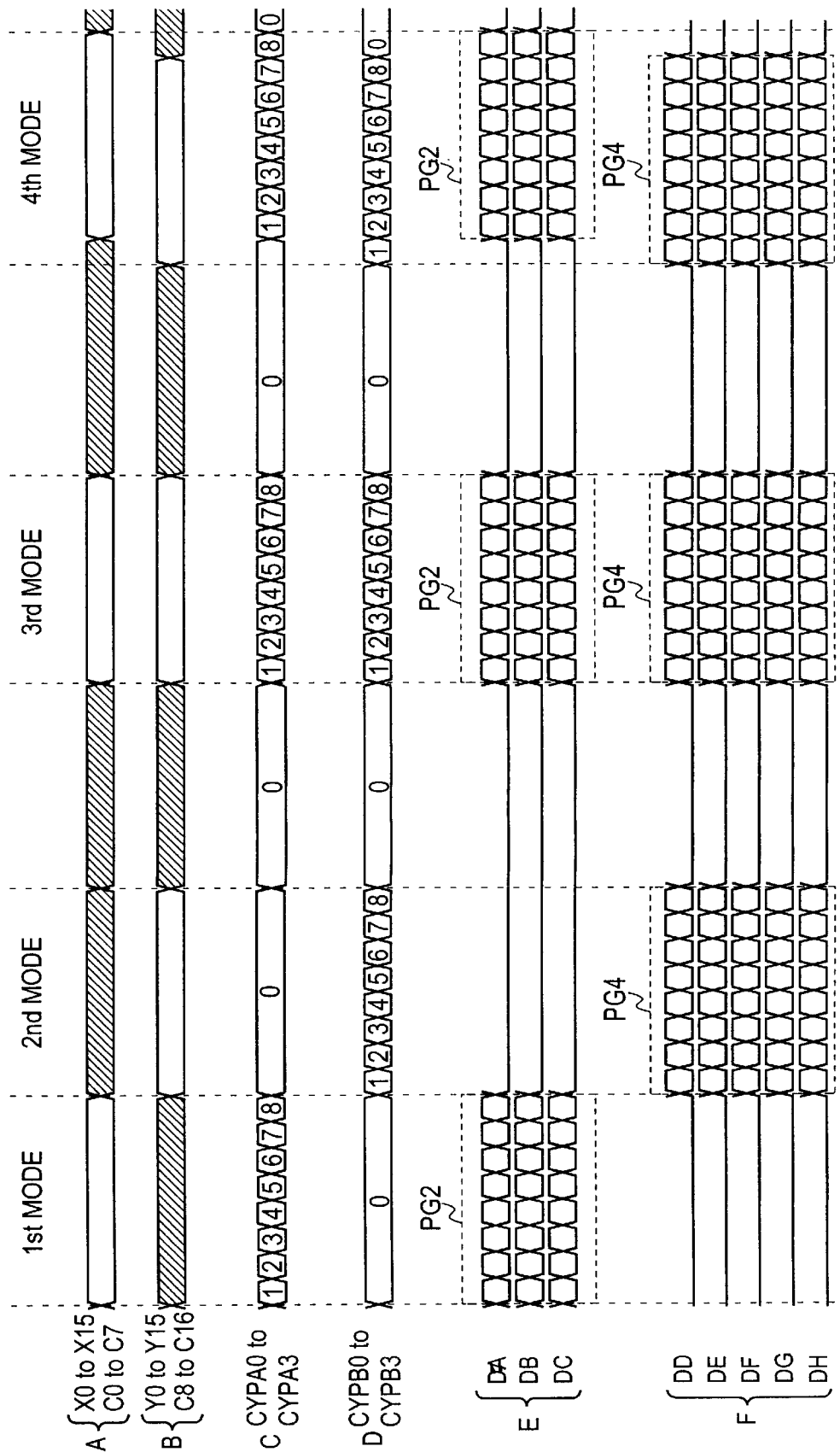
FIG. 2 is a timing chart for explaining the operation of the memory device tester according to the present invention.

FIG. 2 shows the relationship between the row-address packet signal and the column-address packet signal, the former being identified as PG2 and the latter as PG4.

In the case of generating only the row-address packet signal PG2 as indicated by Mode 1, the pattern data X0 to X15 and C0 to C5, which is selected as the row-address packet signal depicted in row A of FIG. 2, is fixed and the value of 4-bit packet select signal CYPA=(CYPA0, . . . , CYPA3) is changed sequentially from 1 to 8 for the packet select parts 123-A, 123-B and 123-C as shown in row C of FIG. 2, by which the row-address packet signal PG2 is generated as the pin data DA to DC depicted in row E of FIG. 2. In this while, the value of packet select signal CYPB=(CYPB0, . . . , CYPB3) is held zero, by which a logical value 0 (FL) is selected in the data selection control parts 122-D to 122-H, and consequently no packet signal is generated for the pin data DD to DH.

Similarly, in Mode 2 in which to generate only the column-address packet signal PG4, the pattern data Y0 to Y15, C6 to C16 and MD0 to MD15 are fixed, and the value of 4-bit packet select signal CYPB=(CYPB0, . . . , CYPB3) is changed sequentially from 1=(0001) to 8=(1000) while the value of packet select signal CYPA=(CYPA0, . . . , CYPA3) is held zero for the packet select parts 123-D to 123-M of the channels 15D to 15H as shown in row D of FIG. 2. By this, the column-address packet signal PG4 can be generated.

In Mode 3 in which to generate the both packets, the pattern data for the row-address packet shown in FIG. 2A and the pattern data for the column packet shown in FIG. 2B are both fixed, and the value of 4-bit packet select signals CYPA=(CYPA0, . . . , CYPA3) and CYPB=(CYPB0, . . . , CYPB3) are both changed sequentially from 1=(0001) to 8=(1000).

Furthermore, the operation of fixing the pattern data Y0 to Y15 and C6 to C16 for the column-address packet shown in FIG. 2B and changing the cycle number value of the packet select signal CYPB=(CYPB0, . . . , CYPB3) sequentially from 1 to 8 and the operation of fixing the pattern data X0 to X15 and C0 to C5 for the row-address packet shown in FIG. 2A and changing the cycle number value of the packet select signal CYPA=(CYPA0, ... , CYPA3) sequentially from 1 to 8 are shifted an arbitrary number of cycles apart in time, by which the row-address packet and the column-address packet can be generated an arbitrary number of cycles apart. Mode 4 in FIG. 2 shows an example in which the two packets are generated at timing shifted one cycle apart.

Effect of the Invention

As described above, according to the present invention, entirely independent generation of plural kinds of packets can be achieved by: preparing plural kinds of packet select signals, such as CYPA=(CYPA0, ... , CYPA3) and CYPB=(CYPB0, ... , CYPB3); selecting either one of the packet select signals CYPA=(CYPA0, ... , CYPA3) and CYPB=(CYPB0, ... , CYPB3) in the respective channels by the packet select parts 123-A to 123-H according to the kind of the packet signal to be generated; and prestoring in the data setting parts 121-A to 121-H the pieces of pattern select data to be selected by the packet select signal selected by the packet select parts 123-A to 123-H in the respective channels.

Figure 12:
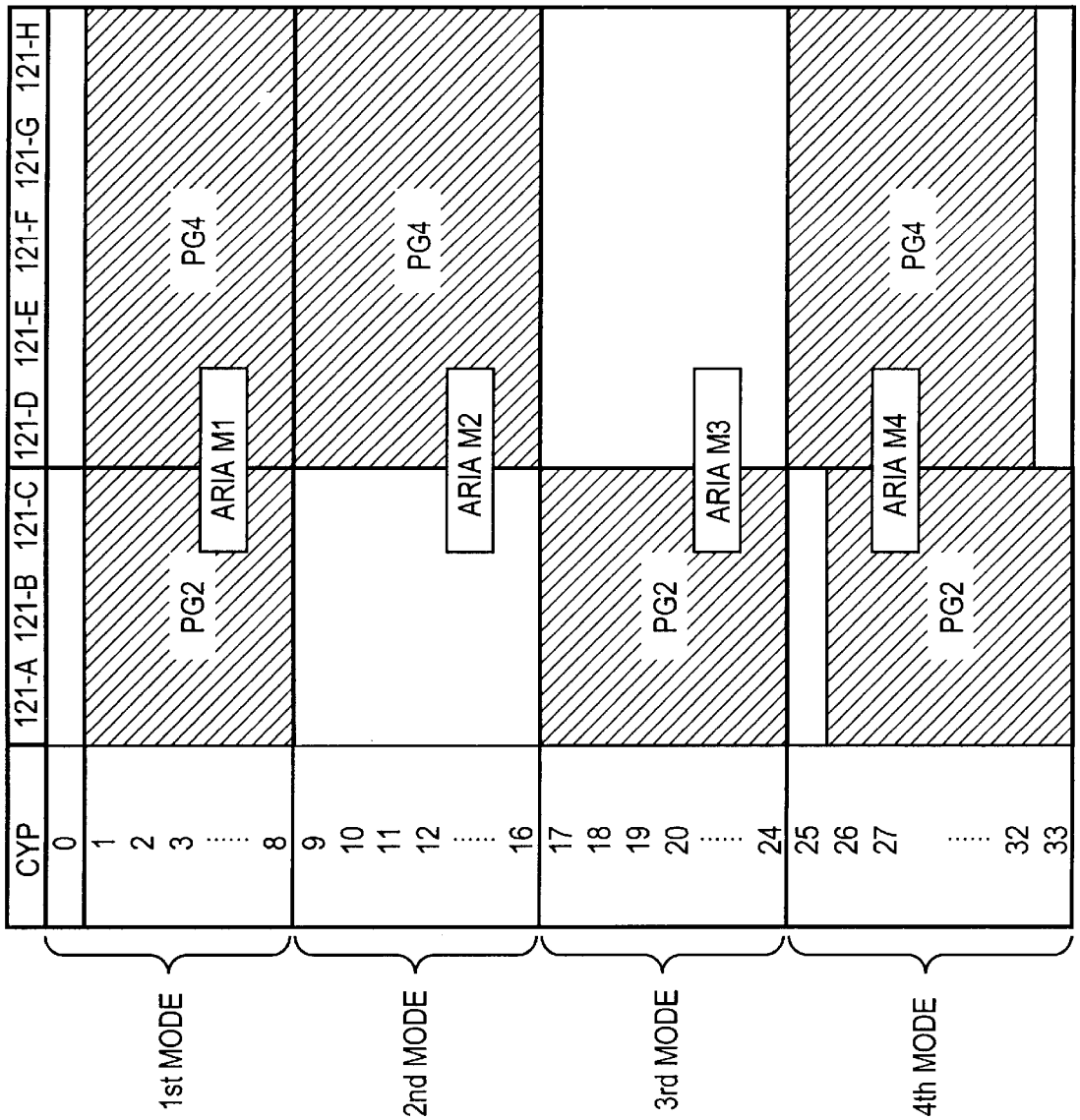
FIG. 12 is a diagram for explaining the scale of data that is prepared in data setting parts in the prior art.

Moreover, the data setting parts 121-A to 121-H each need only to have a storage area corresponding to one kind of packet signal. This avoids the necessity for providing storage areas in pairs for the packet signals PG2 and PG4 for each mode as depicted in FIGS. 12 and 13, and consequently the memory capacity can be made small.

In the above the packet select parts 123-A to 123-H have been described to select the packet select signal CYPA=(CYPA0, ... , CYPA3) for the data selection control parts 122-A to 122-C and the packet select signal CYPB=(CYPB0, ... , CYPB3) for the data selection control parts DEL-D to 122-H, but by changing the scheme for selecting the packet select signals CYPA=(CYPA0, ... , CYPA3) and CYPB=(CYPB0, ... , CYPB3) by the packet select parts 123-A to 123-H for the packet selection control parts 122-A to 122-H, it is also possible to easily deal with other semiconductor memory devices in which the packet is generated for pins of numbers different from that in the above.

It is also possible to employ a construction in which the packet select signals CYPA=(CYPA0, ... , CYPA3) and CYPB=(CYPB0, ... , CYPB3) are fixed applied to the packet selection control parts 122-A to 122-C and 122-D to 122-H without using the packet select parts 123-A to 123-H, though the degree of flexibility in packet generation decreases.

While in the above the present invention has been described to generate two kinds of packet signals, more than two kinds of packet signals can be produced by increasing the kinds of packet select signals with an increase in the number of kinds of packet signals. Moreover, the semiconductor memory device tester has been described to have eight channels, but the number of channels can arbitrarily selected. The numbers of packet select parts 123-A to 123-H, data setting parts 121-A to 121-H and data selection control parts 122-A to 122-H need only to be selected in accordance with the number of channels of the semiconductor memory device tester.

In the above embodiment, the data to be stored in the data setting parts 121-A to 121-H in the respective channels are values that represent the positions of those data bits in the pattern data of FIG. 5A which are output in respective cycles, and such values are stored corresponding to respective cycle numbers indicated by the packet select signal CYP used in the respective channels. But, by dividing the sequence of parallel pattern data into a plurality of areas instead of assigning a sequence of consecutive numbers to the parallel pattern data, each of the values representing the data bit positions can also be expressed by a combination of the number of the area to which the data bit belongs and the number of the data bit in the area. Also it is possible to use an arbitrary sequence of numbers of different values in a predetermined order, instead of using a sequence of consecutive cycle numbers.

What is claimed is:

1. A tester for testing a semiconductor memory device which has at least one row-address input pin for a row-address packet signal and at least one column-address input pin for a column-address packet signal, said tester comprising:

a pattern generator for generating pattern data composed of a predetermined number of parallel bits containing row-address data and column-address data;

a packet select signal generating part provided in said pattern generator, for generating first and second packet select signals for said at least one row-address input pin and said at least one column-address input pin separately of each other, said first and second packet select signals representing the cycle numbers of sequences of cycles in row-address and column-address packet signal periods of respectively preset timing;

a row-address data setting part provided in association with said at least one row-address input pin, for storing pattern select data in correspondence with said cycle numbers of said row-address packet signal period, said pattern select data specifying bit positions, in said pattern data, of pin data to be provided in a format defined by said semiconductor memory device to said at least one row-address input pin in respective cycles of said cycle numbers of said row-address packet signal period;

a column-address data setting part provided in association with said column-address input pin, for storing pattern select data in correspondence with said cycle numbers of said column-address packet signal period, said pattern select data specifying bit positions, in said pattern data, of pin data to be provided in a format defined by said semiconductor memory device to said at least one column-address input pin in respective cycles of said cycle numbers of said column-address packet signal period;

a row-address data selection control part provided in association with said row-address data setting part and supplied with one of said first and second packet select signals from said pattern generator, for selecting from among said pattern select data stored in said row-address data setting part the pattern select data corresponding to the cycle number indicated by said one packet select signal and for outputting said selected pattern select data as a pattern select signal;

a column-address data selection control part provided in association with said column-address data setting part and supplied with the of said first and second packet select signals from said pattern generator, for selecting from among said pattern select data stored in said row-address data setting part the pattern select data corresponding to the cycle number indicated by said other packet select signal and for outputting said selected pattern select data as a pattern select signal;

a row-address packet generating part provided in association with said row-address data setting part and supplied with said pattern select signal from said row-address data selection control part, for supplying to said at least one row-address input pin a pattern data bit selected from among said pattern data from said pattern generator in accordance with said pattern select data indicated by said pattern select signal provided from said row-address data selection control part; and a column-address packet generating part provided in association with said column-address data setting part and supplied with said pattern select signal from said column-address data selection control part, for supplying to said at least one column-address input pin a pattern data bit selected from among said pattern data from said pattern generator in accordance with said pattern select data indicated by said pattern select signal provided from said column-address data selection control part.

2. The tester of claim 1, wherein said semiconductor memory device has: pluralities of row-address input pins and column-address input pins; pluralities of row-address data setting parts and row-address data selection control parts provided corresponding to said plurality of row-address input pins, respectively; and pluralities of column-address data setting parts and column-address data selection control parts provided corresponding to said plurality of column address input pins, respectively.

3. The tester of claim 1, wherein said tester further comprising:

row-address packet select parts provided corresponding to said row-address input pins, for selecting one of said first and second packet select signals fed from said pattern generator and apply to said row-address data control parts; and column-address packet select parts provided corresponding to said column-address input pins, for selecting one of said first and second packet select signals fed from said pattern generator and apply to said column-address data control parts.

4. The tester of claim 2, wherein said tester further comprising:

row-address packet select parts provided corresponding to said row-address input pins, for selecting one of said first and second packet select signals fed from said pattern generator and apply to said row-address data control parts; and column-address packet select parts provided corresponding to said column-address input pins, for selecting one of said first and second packet select signals fed from said pattern generator and apply to said column-address data control parts.

* * * * *